United States Patent [19]

Chung

[11] Patent Number: 5,089,356

[45] Date of Patent: Feb. 18, 1992

[54] CARBON FIBER REINFORCED TIN-LEAD ALLOY AS A LOW THERMAL EXPANSION SOLDER PREFORM

[75] Inventor: Deborah D. L. Chung, Pittsburgh, Pa.

[73] Assignee: The Research Foundation of State Univ. of New York, Albany, N.Y.

[21] Appl. No.: 583,284

[22] Filed: Sep. 17, 1990

[51] Int. Cl.$^5$ ................. B32B 5/02; C22C 1/09; B23K 35/28

[52] U.S. Cl. ................. 428/608; 428/614; 428/634

[58] Field of Search ............ 428/608, 605, 614, 634, 428/643, 644, 646, 647, 648; 228/56.3, 121, 122, 123, 246

[56] References Cited

U.S. PATENT DOCUMENTS

| | | | |
|---|---|---|---|
| 1,052,761 | 2/1913 | Stanweg | 228/56.3 |
| 2,972,657 | 2/1961 | Stemke | 228/56.3 |
| 3,358,898 | 12/1967 | Medkeff et al. | 228/56.3 |
| 3,605,902 | 9/1971 | Ault | 428/608 |
| 3,622,283 | 11/1971 | Sara | 428/634 |
| 3,720,257 | 3/1973 | Beutler et al. | 428/614 |
| 3,860,443 | 1/1975 | Lachmann et al. | 428/614 |
| 4,132,828 | 1/1979 | Nakamura et al. | 428/608 |
| 4,157,409 | 6/1979 | Levitt et al. | 427/299 |
| 4,223,075 | 9/1980 | Harrigan et al. | 428/614 |
| 4,341,823 | 7/1982 | Sexton et al. | 428/634 |
| 4,497,875 | 2/1985 | Arakawa et al. | 428/621 |
| 4,529,836 | 7/1985 | Powers et al. | 228/123 |
| 4,683,368 | 7/1987 | Das | 428/614 |
| 4,875,616 | 10/1989 | Nixdorf | 104/97 |
| 4,962,003 | 10/1990 | Lhymn et al. | 428/614 |

FOREIGN PATENT DOCUMENTS

| | | |
|---|---|---|
| 299483 | 1/1989 | European Pat. Off. . |
| 3838968 | 7/1989 | Fed. Rep. of Germany . |
| 55-72046 | 5/1980 | Japan ............ 428/620 |
| 61-250127 | 11/1986 | Japan . |
| 63-103032 | 5/1988 | Japan . |

OTHER PUBLICATIONS

IBM Technical Disclosure Bulletin, vol. 29, No. 4, Sep. 1986.
Adv. Res. Strength Fract. Mater., Int. Conf. Fract., 4th Meeting Date 1977, vol. 3B, 1067-71.
6th Int. Conf. on Composite Materials and 2nd European Conf. on Composite Materials (ICCM & ECCM), vol. 2, London UK, 20-24, Jul. 1987, pp. 2,182-2,189.
Pract. Met. Compos., Spring Meet., B47-B50, London, Engl., Inst. Metall. (1974).
Journal of Materials Science Letters 3 (1984) 232-238 "Squeeze casting of carbon fibre-tin alloy composites".
Proc.—Electron. Compon. Conf., 33rd, 264-70 (1983) "Development of Copper-Carbon Fiber Composite for Electrodes".
Transactions of the Japan Institute of Metals, vol. 28, No. 3 (1987), pp. 238 to 246.
Compos. '86 [Eighty-Six]: Recent Adv. Jpn. U.S., Proc. Jpn.—U.S. Conf. Compos. Mater., 3rd, 465-72.
Int. Sampe Symp. Exhib., 31 (Mater. Sci. Future), 1145-53 (1986).
Metallurgical transactions A, vol. 18A, Aug. 1987—1519 "The Squeeze Infiltration Process for Fabrication of Metal-Matrix Composites".
Metallography 20: 237-246 (1987).
Sampe Quarterly 20(4), 43-46 (1989) "A New Infiltration Process for the Fabrication of Metal Matrix Composites".

*Primary Examiner*—John J. Zimmerman
*Attorney, Agent, or Firm*—Michael L. Dunn

[57] ABSTRACT

A solder joint between two surfaces comprising an intermediate composite solder preform, said preform comprising metal coated carbon fibers contained in a metal matrix, said fibers comprising from 2 to 80 percent by volume of the composite, said metal matrix melting at a temperature below 600° C. and containing at least 15 weight percent tin.

38 Claims, 6 Drawing Sheets

CARBON FIBER REINFORCED TIN-LEAD ALLOY AS A LOW THERMAL EXPANSION SOLDER PREFORM

BACKGROUND OF THE INVENTION

1. Field of the Invention

This invention is related to a composite solder and a solder joint comprising same. The composite solder is in the form of a solder preform. A solder preform is solder which has been shaped into a two-dimensional shape such as a sheet or ring. A composite solder is a solder in the form of a composite material.

2. Description of the Prior Art

Solder preforms are used to join various parts of an electronic package. For example, they are used to join a ceramic cap and a multilayer ceramic substrate in a multichip module. Because the thermal expansion coefficient of a solder is in general much higher than that of a ceramic, the solder joint suffers from a poor resistance to thermal fatigue. Thus, there is a need for a solder with a low coefficient of thermal expansion.

Composite materials can be tailored to exhibit a chosen thermal expansion coefficient, as the filler species and the filler volume fraction can be judiciously chosen. For a low thermal expansion composite, the filler must have a low thermal expansion coefficient. Moreover, the filler should preferably be a good electrical conductor, because the soldered joint may serve as an electrical connection as well as a mechanical connection. It should also preferably be a good thermal conductor for heat dissipation from the electronic package. In addition, the filler should be wetted well by liquid solder in order to facilitate composite fabrication A further requirement is that, upon remelting and solidification of the solder in the solder-matrix composite, the filler distribution in the composite remains uniform.

Molybdenum particles have been used as a filler in solder-matrix composites, as for example described in IBM Technical Disclosure Bulletin 29(4), 1573 (1986). However, their distribution in the solder (Sn-40% Pb alloy) became non-uniform after remelting and solidification of the solder in the composite. Thus, molybdenum is not a suitable filler in spite of its low coefficient of thermal expansion.

Carbon fibers have nearly zero thermal expansion coefficient. In contrast to ceramic fibers (which also have low thermal expansion coefficients), carbon fibers are a good electrical conductor and a good thermal conductor; however, the effect, if any, of carbon fibers in a solder preform have not been properly investigated.

Tin-lead alloys are most commonly used for solders. Carbonfiber reinforced tin-lead alloys had been previously fabricated by liquid metal infiltration for bearing applications, [C.F. Old, I. Barwood and M.G. Nicholas, Pract. Met. Compos., Spring Meet., B47-B50. London, Engl., Inst. Metall. (1974)] and by investment casting for fundamental process study [A. Miyase and K. Piekarski, Adv. Res. Strength Fract. Mater., Int. Conf. Fract., 4th, Meeting Date 1977, Volume 3B, 1067-71. Edited by David M.R. Taplin. Elmsford, NY, Pergamon, 1978]. For both methods, the carbon fibers were electroplated with copper in order to ensure good wetting of the fibers by the alloy. Carbon-fiber reinforced tin (containing 7.5 wt. % Sb and 3.5 wt. % Cu) have also been fabricated by squeeze casting for fundamental process study wherein the carbon fibers were electroplated with nickel in order to avoid the oxidation of the fibers during casting.

It was not, however, recognized that such carbon fiber reinforced materials would have particularly good utility in the formation of solder joints.

BRIEF DESCRIPTION OF THE INVENTION

In accordance with the present invention, there is therefore provided a solder joint between two surfaces comprising an intermediate composite solder preform, said preform comprising metal coated carbon fibers contained in a metal matrix, said fibers comprising from 2 to 80 percent by volume of the composite, said metal matrix melting at a temperature below 600° C. and containing at least 15 weight percent tin.

The composite solder preform, preferably in sheet form, displays a low thermal expansion coefficient. Carbon fibers in a continuous form are very effective for lowering the thermal expansion coefficient of the composite and prevent the fiber distribution from becoming nonuniform after remelting and solidification.

BRIEF DESCRIPTION OF THE DRAWINGS

For a better understanding of the invention, reference should be had to the accompanying drawings wherein:

FIG. 4 is SEM photographs of polished cross-sections of 4(a) the solder (0 vol. % fibers) - alumina interface (with the solder at the left side of the interface), and 4(b) the solder (0 vol. % fibers) - Kovar interface (with the solder at the right side of the interface).

FIG. 5 is SEM photographs of polished cross-sections of 5(a) the composite (17.12 vol. % fibers) - alumina interface (with the composite at the right side of the interface), and 5(b) the composite (17.12 vol. % fibers) Kovar interface (with the composite at the left side of the interface).

FIG. 6 is optical micrographs of 6(a) the composite (8.2 vol. % fibers) alumina interface (with the composite at the upper side of the interface), and 6(b) the composite (8.2 vol. % fibers) - Kovar interface (with the composite at the upper side of the interface), just after the start of debonding.

DETAILED DESCRIPTION OF THE INVENTION

The thermal expansion coefficient in a direction parallel to the sheet decreases with increasing volume fraction of fibers in the composite. For a volume fraction ranging from 8 to 55%, the thermal expansion coefficient at 25° C. in a direction parallel to the sheet ranges from $-1 \times 10^{-6}$/° C. to $11 \times 10^{-6}$/° C. For a volume fraction ranging from 17 to 43%, the thermal expansion coefficient at 25° C. in a direction parallel to the sheet ranges from $0.5 \times 10^{-6}$/° C. to $8.5 \times 10^{-6}$/° C. For a volume fraction of about 29%, the thermal expansion coefficient at 25° C. in a direction parallel to the sheet is about $4 \times 10^{-6}/°$ C.

The solder metal is preferably a metal either elemental or alloy with a solidus temperature below 500° C.; it preferably contains one or more of the elements tin, lead, antimony, cadmium, copper, silver, gold, zinc, indium, gallium, bismuth, tellurium, aluminum, mercury, selenium, thallium and arsenic; it is preferably chosen from the group tin-lead, gold-tin and lead-tin-silver; it is most preferably tin-lead. Desirably, the solder metal is at least 50 weight percent tin. Other desirable metals are lead and zinc which may optionally be used in quantities of at least 10 weight percent. Usually less than 10 combined weight percent of the other metals are used. The metal coating is preferably copper and preferably about 1 $\mu$m thick.

A substantial portion of said carbon fibers preferably extend in the same direction or may be used in the form of a fabric; any suitable precursor of said carbon fibers may be used such as pitch or textile filaments. Such fibers may also be vapor grown. Graphite fibers are especially suitable.

There is also provided a squeeze casting process for preparing said composite solder sheets. In this process, the mold temperature is in the range from 100 to 200° C. and the pressure is in the range from 10 to 70 MPa.

The composite solder is technologically attractive because of its low thermal expansion coefficient. The low expansion results in an increased thermal fatigue life for solder joints between materials with low thermal expansion coefficients, such as ceramics, which are encountered in electronic packages in the form of caps and multilayer substrates in multichip modules.

The thermal fatigue of solder joints presently limits the reliability of electronics severely.

The following example serves to illustrate and not limit the present invention.

EXAMPLE 1

Composite Fabrication

The solder alloy used contained 60 wt. % Sn and 40 wt. % Pb, as this is the most commonly used solder composition. The solidus of this alloy is 183° C.; the liquidus is about 192° C.

The filler used was continuous copper coated carbon fibers. The fibers were pitch-based, with a diameter of 10 $\mu$m, a tensile modulus of 690 GPa, a tensile strength of 2400 MPa and a tensile ductility (elongation) of 0.3%. The copper coating was slightly more than 1 $\mu$m thick. Uncoated and unsized fibers were also used for the sake of comparison. The fibers were used in the form of 2,000 fiber tows.

The carbon-fiber reinforced solder was prepared by squeeze casting, using a mold cavity of length 6 cm and width 1.2 cm. After placing carbon fibers in the form of a tow of length 5 cm unidirectionally along the length of the mold cavity, a small amount of dilute hydrochloric acid was poured into the mold. (The acid treatment was for the purpose of activating the surface of the uncoated fibers for better bonding to the matrix, but it was applied to both coated and uncoated fibers for consistency.) Then the temperature of the mold was raised to 150° C. in order to cause the acid to evaporate. After that, liquid solder heated to 400° C. was poured into the mold maintained at 150° C. and pressure ranging from 30 to 50 MPa was immediately applied through a piston at the top of the mold. The pressure was maintained for 10 min while the mold was allowed to cool to near room temperature.

Composite Characterization

Solder-matrix composites containing various volume fractions of carbon fibers were characterized in terms of their tensile properties and thermal expansion coefficients.

A. Tensile properties

Tensile tests were performed on composites containing copper-coated carbon fibers as well as those containing uncoated carbon fibers. The tests were carried out using a hydraulic Materials Testing System (MTS). The strain was measured by using a strain gage (Measurements Group, Inc., gage type EA-13-120LZ-120, resistance = 120.0 ($\pm$0.3%) ohms, gage factor = 1.095$\pm$0.5% at 75° F.). The tensile stress was applied along the fiber direction. The gage length was 4.16 cm.

Figure 1:
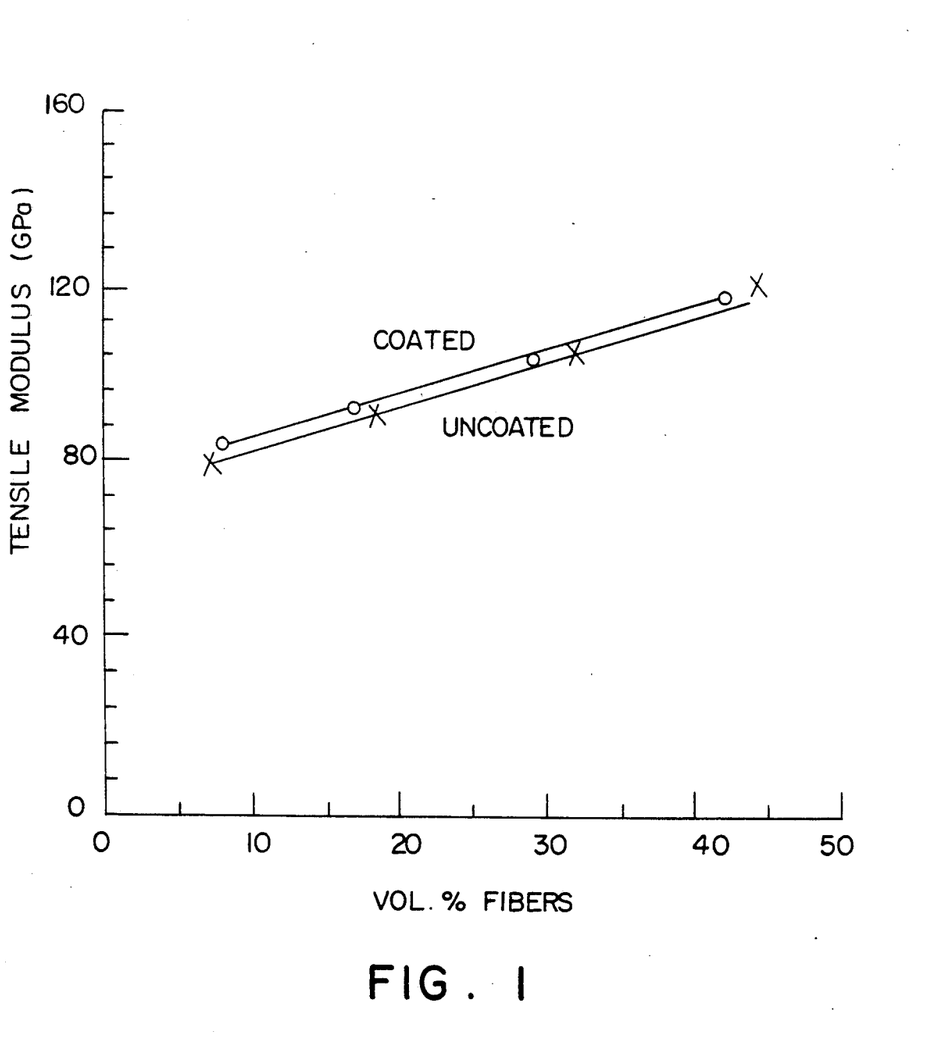
FIG. 1 is a graph of the tensile modulus vs. the fiber content, such that data for copper coated carbon fibers are shown by circles and those for uncoated carbon fibers are shown by crosses.
Figure 2:
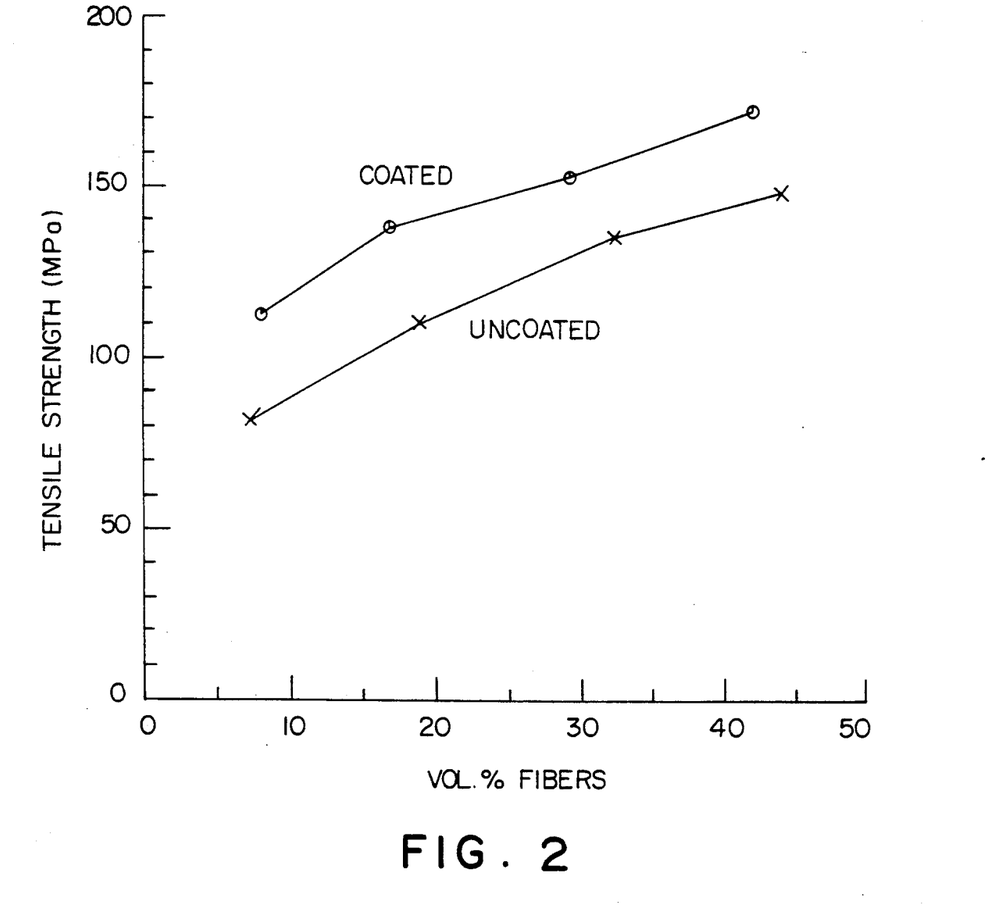
FIG. 2 is a graph of the tensile strength vs. the fiber content, such that data for copper coated carbon fibers are shown by circles and those for uncoated carbon fibers are shown by crosses.
Figure 3:
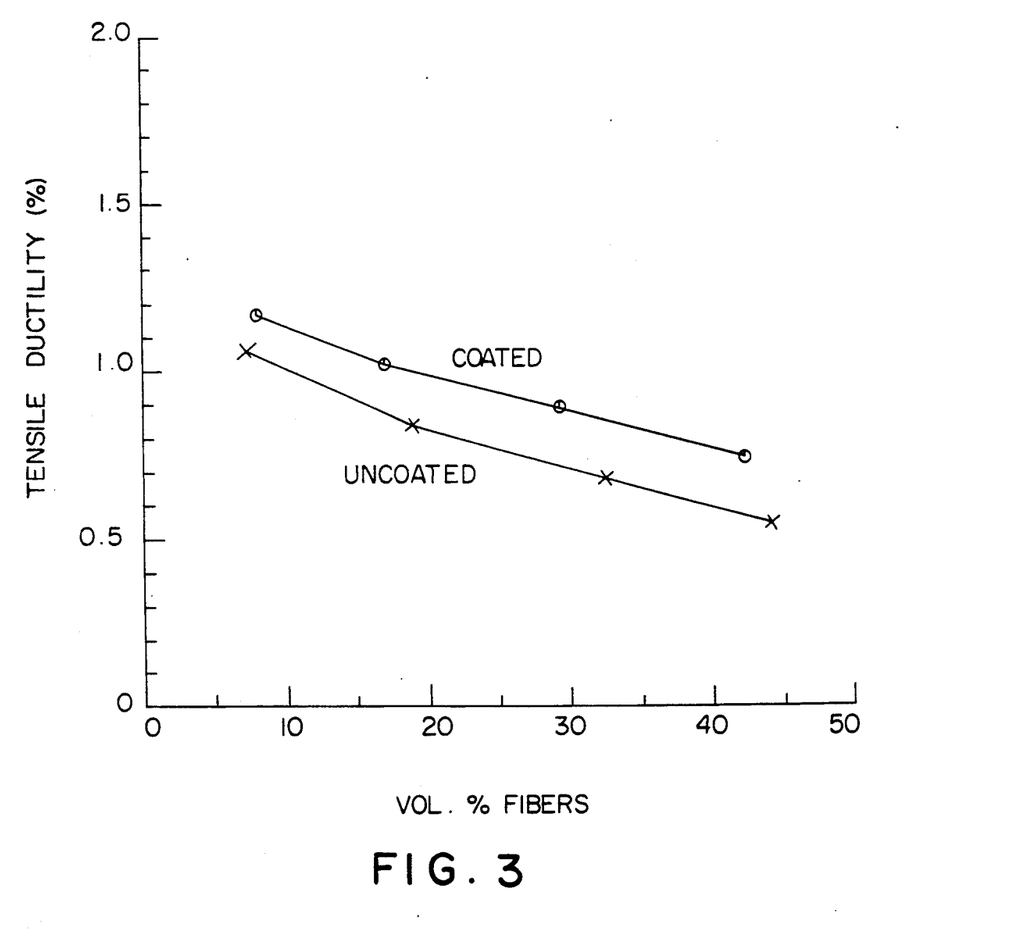
FIG. 3 is a graph of the tensile ductility (elongation) vs. the fiber content, such that data for copper coated carbon fibers are shown by circles and those for uncoated carbon fibers are shown by crosses.

FIG. 1-3 show the tensile modulus, tensile strength and tensile ductility (elongation) as functions of the volume fraction of fibers in the composite solder. The modulus and strength increased with increasing fiber content, while the ductility decreased with increasing fiber content, as expected. The strength and ductility were higher for composites containing copper-coated carbon fibers than for those containing uncoated fibers. This is consistent with the improved wetting between the matrix and fiber due to the copper coating. The modulus was not affected by the copper coating, as expected.

B. Thermal expansion coefficient

The thermal expansion coefficients of composites containing 8 to 42 vol. % copper coated carbon fibers were measured at 25-15° C. parallel and perpendicular to the fiber direction. Prior to the measurement, the specimens were annealed in vacuum at 150° C. for 2 h and then allowed to cool to room temperature. The measurements were made using a Mettler TMA40 Thermal Mechanical Analyzer operated at a heating rate of 10° C./min.

Table I shows the thermal expansion coefficients. The values parallel to the fibers were lower than the corresponding ones perpendicular to the fibers. For each orientation, the coefficient parallel to the fibers decreased markedly with increasing fiber content, while the coefficient perpendicular to the fibers decreased much less with increasing fiber content. The coefficient parallel to the fibers even reached values close to zero at fiber contents above 42 vol. %. The coefficient increased with increasing temperature for a given fiber content and a given orientation.

Solder Bond Testing

A. Bonding process

The ability of the solder composites containing coppercoated carbon fibers to bond together materials of low thermal expansion coefficients was tested. The materials chosen included a ceramic (alumina or $Al_2O_3$, electronic grade, thermal expansion coefficient = $6.7 \times 10^{-6}/°$ C. at 25° C.) and a metal alloy (Kovar or Fe-29% Ni-17% Co, thermal expansion coefficient = $5.3 \times 10^{-6}/°$ C. at 25° C.). In order to promote wetting by the solder, the bonding surface of each of these materials was coated with a thin film of gold (20–40 Å thick) by vacuum evaporation.

The composite samples used were of length 2 cm (along the fiber direction), width 1.2 cm and thickness 0.58 cm. The alumina and Kovar had thicknesses 0.102 and 0.025 cm, respectively.

Solder joints between two sheets of alumina and between a sheet of alumina and a sheet of Kovar were made by hot-pressing the composite solder between the two sheets to be joined at 180 and 500 psi (4 MPa) for 20 min. Even though 180° C. is just below the solidus temperature, the solder at the surface of the composite did melt during the heating. This slight melting was necessary for bonding. Joints of a similar quality could be made at temperatures above the solidus temperature. In particular, a joint was made between alumina pieces at 187° C. at which partial melting of the solder occurred. In spite of the partial melting, the carbon fiber (copper-coated or not) distribution remained unchanged by the melting and subsequent solidification.

B. Microstructure

Figure 4A:
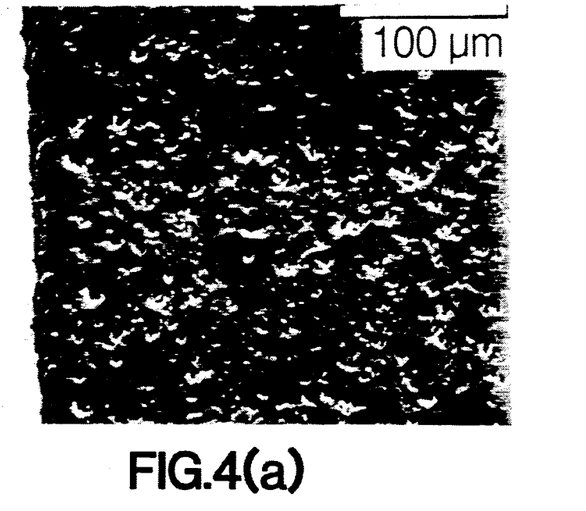
Figure 4B:
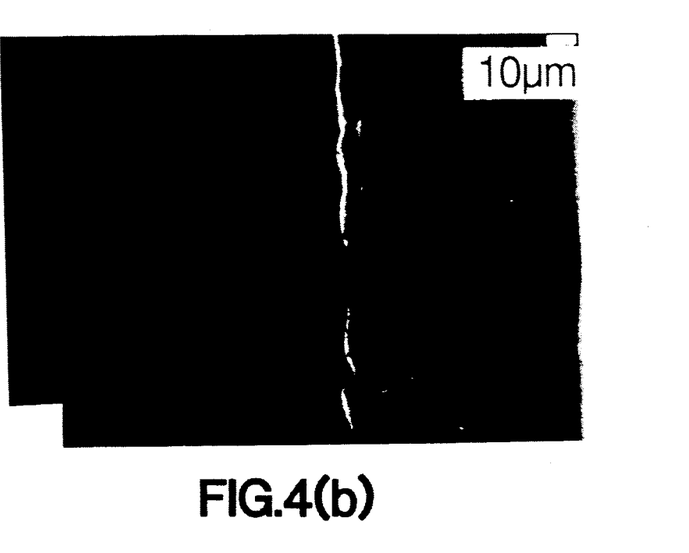

FIG. 4 shows scanning electron microscope (SEM) photographs of polished cross-sections of 4(a) the solder (0 vol. % fibers) - alumina interface, and 4(b) the solder (0 vol. % fibers) - Kovar interface. No void or crack was observed between the solder and the alumina or Kovar.

Figure 5A:
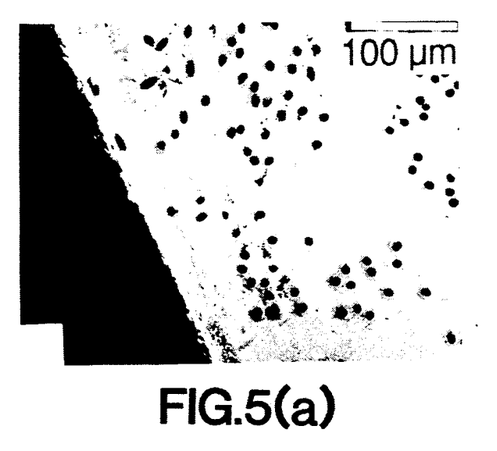
Figure 5B:
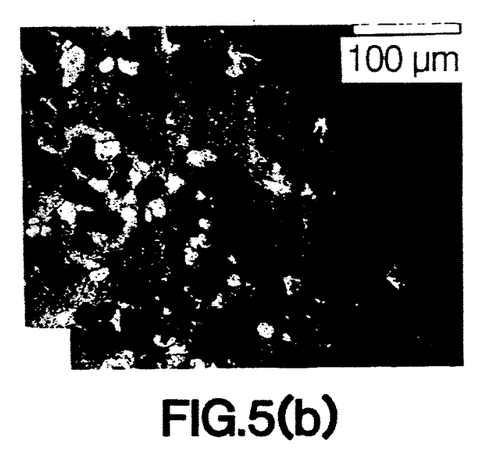

FIG. 5 shows SEM photographs of polished cross-sections of 5(a) the composite (17.12 vol. % fibers) - alumina interface, and 5(b) the composite (17.12 vol. % fibers) - Kovar interface. The composite was viewed in the direction of the fibers in each photograph. The tip of each carbon fiber appeared as a black circle surrounded by a halo, which was due to the reaction of the copper coating with the solder alloy matrix. The matrix consisted of two microconstituents, namely a proeutectic phase (white patches) and a eutectic solid. No void or crack was observed between the composite solder and the alumina or Kovar.

C. Thermal fatigue testing

The ability of the solder bond to withstand thermal cycling between room temperature and 100° C. was investigated by observing the solder joints under an optical microscope after every cycle to look for the start of debonding (i.e., slight cracking between the solder composite and $Al_2O_3$ or between the solder composite and Kovar). The thermal cycling was carried out by alternating between furnace heating at 100° C. for 25 min and room temperature equilibration for at least 30 min.

Table II shows the thermal fatigue life (i.e., the number of cycles for debonding to start) for each composite composition and for each of two pairs of joined materials. The thermal fatigue life was longest for an intermediate fiber content of 29.42 vol. % for both pairs of joined materials. This is reasonable because the thermal expansion coefficient parallel to the fiber direction was closest to the values of $Al_2O_3$ and Kovar for a fiber content of 29.42 vol. %, as shown in Table I.

Figure 6A:
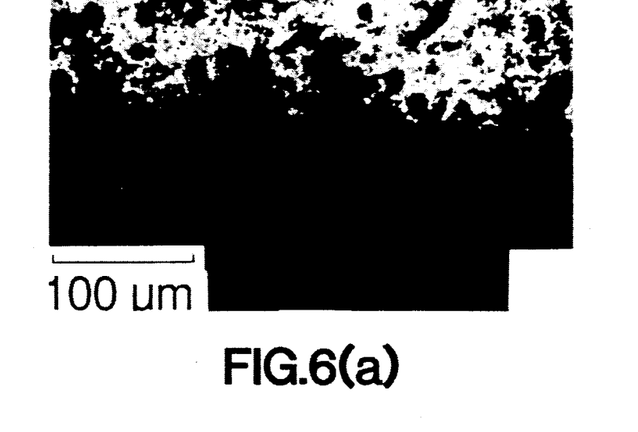
Figure 6B:
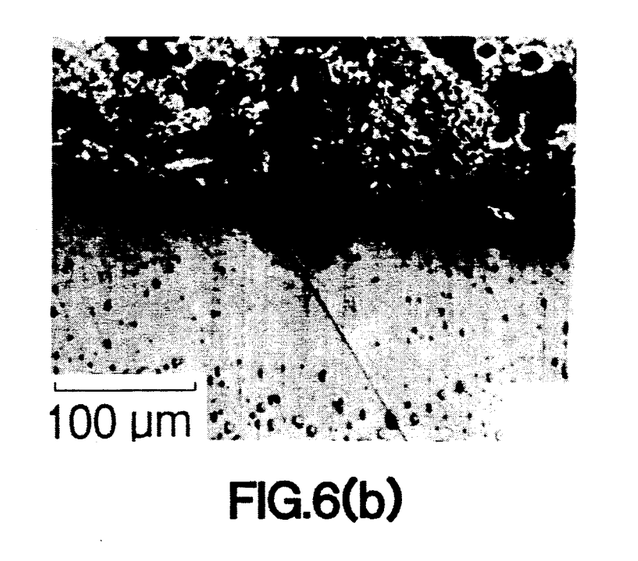

FIG. 6 shows optical microscope photographs of 6(a) the solder composite (8.2 vol. % copper coated carbon fibers) - alumina interface and 6(b) the solder composite (8.2 vol. % copper coated carbon fibers) - Kovar interface, just after the start of debonding. Each photograph shows a crack along the interface.

SUMMARY

A tin-lead (40 wt. % Pb) solder-matrix composite preform containing continuous and unidirectional copper coated carbon fibers was developed. By varying the volume fraction of carbon fibers in the composite, I can control the thermal expansion coefficient all the way to zero. For example, for 29 vol. % fibers, the thermal expansion coefficient was $8 \times 10^{-6}/°$ C. (25–105° C.) in the direction parallel to the fibers, compared to a corresponding value of $24 \times 10^{-6}/°$ C. for plain solder. The thermal fatigue life was determined by thermal cycling between 25 and 100° C. and counting the cycles needed for debonding to start, as revealed by optical microscopy. For the composite containing 29 vol. % fibers, the thermal fatigue life of a 2 cm long alumina-to-alumina solder joint was 183 cycles, compared to a life of 98 cycles for a joint made with plain solder. Hence, the thermal fatigue life was increased by 87%. In addition, the fibers increased the tensile modulus and tensile strength of the solder, and are therefore expected to increase the creep resistance also.

The solder composites were successfully made by squeeze casting for copper-coated carbon fibers as well as the uncoated fibers. However, copper-coated carbon fibers are preferred because they resulted in composites that were higher in tensile strength and ductility. This effect of the copper is associated with the fact that copper improves the wetting of the fibers by the solder liquid.

TABLE I

Thermal expansion coefficients of solder-matrix composites containing various volume fractions of copper coated carbon fibers, in directions parallel ($\parallel$) and perpendicular ($\perp$) to the fibers.

| Vol. % fibers | Direction | Thermal expansion coefficient ($10^{-6}/°$C.) | | | | | | | | |
|---|---|---|---|---|---|---|---|---|---|---|
| | | 25° C. | 35° C. | 45° C. | 55° C. | 65° C. | 75° C. | 85° C. | 95° C. | 105° C. |
| 8.2 | $\parallel$ | 10.42 | 11.37 | 12.16 | 13.09 | 14.23 | 15.10 | 15.94 | 16.23 | 16.98 |
| | $\perp$ | 18.32 | 19.47 | 20.11 | 21.42 | 22.37 | 22.90 | 23.42 | 24.78 | 25.32 |
| 17.12 | $\parallel$ | 8.43 | 8.90 | 9.24 | 9.79 | 10.21 | 11.80 | 12.72 | 13.41 | 14.10 |
| | $\perp$ | 17.39 | 18.00 | 18.47 | 19.41 | 20.83 | 21.74 | 22.71 | 23.62 | 24.83 |
| 29.42 | $\parallel$ | 4.31 | 4.90 | 5.70 | 6.92 | 7.91 | 8.42 | 9.53 | 10.43 | 11.84 |
| | $\perp$ | 16.80 | 17.80 | 18.32 | 19.11 | 20.52 | 20.99 | 21.43 | 22.84 | 24.12 |
| 42.37 | $\parallel$ | 0.62 | 0.74 | 0.92 | 1.10 | 1.14 | 1.20 | 1.27 | 1.36 | 1.47 |
| | $\perp$ | 15.93 | 16.24 | 17.32 | 18.42 | 18.99 | 19.92 | 21.11 | 22.10 | 23.8 |
| 54.1 | $\parallel$ | −0.89 | −0.80 | −0.64 | −0.64 | −0.64 | −0.62 | −0.60 | −0.62 | −0.62 |

TABLE II

Thermal fatigue life of alumina-to-alumina solder joints and alumnia-to-Kovar solder joints for various volume fractions of copper coated carbon fibers in the composite solder.

| Joint | Vol. % fibers | Fatigue life (cycles) |
|---|---|---|
| Alumina-to-alumina | 0 | 98 ± 3 |
| | 8.2 | 104 ± 4 |

TABLE II-continued

Thermal fatigue life of alumina-to-alumina solder joints and alumina-to-Kovar solder joints for various volume fractions of copper coated carbon fibers in the composite solder.

| Joint | Vol. % fibers | Fatigue life (cycles) |
| --- | --- | --- |
| | 17.12 | 149 ± 2 |
| | 29.42 | 183 ± 9 |
| | 42.37 | 91 ± 1 |
| | 54.1 | 81 ± 6 |
| Alumina-to-Kovar | 0 | 112 ± 1 |
| | 8.2 | 119 ± 2 |
| | 17.12 | 178 ± 8 |
| | 29.42 | 210 ± 12 |
| | 42.37 | 107 ± 4 |
| | 54.1 | 96 ± 3 |

What is claimed is:

1. A solder joint between two surfaces comprising an intermediate composite solder preform, said preform comprising metal coated carbon fibers contained in a metal matrix, said fibers comprising from 2 to 80 percent by volume of the composite, said metal matrix melting at a temperature below 600° C. and containing at least 15 weight percent tin.

2. The solder joint of claim 1 wherein the preform is a sheet and the fibers comprise from 8 to 55 percent by volume of the composite.

3. The solder joint of claim 2 wherein the metal matrix comprises a eutectic alloy.

4. The solder joint of claim 2 wherein the metal matrix comprises a metal selected from the group consisting of lead, cadmium, indium, selenium, tellurium, thallium, tin and zinc.

5. The solder joint of claim 2 wherein the metal matrix comprises a mixture of at least two metals selected from the group consisting of lead, tin, bismuth, tellurium, silver, copper, antimony, aluminum, gold, silver, zinc, cadmium, mercury, indium, selenium, gallium, arsenic and thallium.

6. The solder joint of claim 5 wherein the mixture comprises at least 50 weight percent tin.

7. The solder joint of claim 5 wherein the mixture comprises at least 10 weight percent lead.

8. The solder joint of claim 5 wherein the mixture comprises at least 10 weight percent zino.

9. The solder joint of claim 5 wherein the mixture comprises less than 10 weight percent combined metal selected from the group consisting of bismuth, tellurium, copper, antimony, aluminum, gold, cadmium, mercury, indium, selenium, and thallium.

10. The solder joint of claim 9 wherein the mixture is a tin-lead alloy.

11. The solder joint of claim 1 wherein the carbon fibers are copper coated fibers.

12. The solder joint of claim 2 wherein the carbon fibers are copper coated fibers.

13. The solder joint of claim 5 wherein the carbon fibers are copper coated fibers.

14. The solder joint of claim 6 wherein the carbon fibers are copper coated fibers.

15. The solder joint of claim 7 wherein the carbon fibers are copper coated fibers.

16. The solder joint of claim 8 wherein the carbon fibers are copper coated fibers.

17. The solder joint of claim 9 wherein the carbon fibers are copper coated fibers.

18. The solder joint of claim 11 wherein the fibers are graphite fibers.

19. The solder joint of claim 1 wherein the fibers are graphite fibers having an average diameter of from 0.1 to 20 microns.

20. The solder joint of claim 1 wherein the fibers have an average aspect ratio of at least 4:1, an average diameter of from 0.1 to 100 microns and an average length of from 10 microns to the length of the preform.

21. The solder joint of claim 2 wherein the fibers have an average aspect ratio of at least 4:1, an average diameter of from 0.1 to 100 microns and an average length of from 10 microns to the length of the preform.

22. The solder joint of claim 12 wherein the fibers have an average aspect ratio of at least 4:1, an average diameter of from 0.1 to 100 microns and an average length of from 10 microns to the length of the preform.

23. The solder joint of claim 12 wherein the mixture is a tin-lead alloy.

24. The solder joint of claim 20 wherein the mixture is a tin-lead alloy.

25. The solder joint of claim 21 wherein the mixture is a tin-lead alloy.

26. The solder joint of claim 22 wherein the metal matrix is a tin-lead alloy.

27. A solder joint comprising composite solder sheet intermediate and securing two surfaces which displays a thermal expansion coefficient ranging from $-1 \times 10^{-6}/°$ C. to b $11 \times 10^{-6}/°$ C. at 25° C. in a direction parallel to the sheet, said composite solder substantially comprising continuous copper coated carbon fibers in a solder metal matrix, such that the copper coated carbon fibers occupy from 8 to 55 vol. % of the composite.

28. The solder joint as specified in claim 27, wherein said solder metal is a metal with a solidus temperature below 500° C.

29. The solder joint as specified in claim 27, wherein said solder metal contains one or more elements selected from the group consisting of tin, lead, antimony, cadmium, copper, silver, gold, zinc, indium, gallium, bismuth and arsenic.

30. The solder joint as specified in claim 27, wherein said solder metal is selected from the group consisting of tin-lead, gold-tin and lead-tin-silver.

31. The solder joint as specified in claim 27, wherein said solder metal is tin-lead.

32. The solder joint as specified in claim 27, wherein said copper coating is about 1 μm thick.

33. The solder joint as specified in claim 27 produced by a squeeze casting process, wherein the mold temperature is in the range from 100 to 200° C. and the pressure is in the range from 10 to 70 MPa.

34. The solder joint of claim 29 which displays a thermal expansion coefficient ranging from $0.5 \times 10^{-6}/°$ C. to $8.5 \times 10^{-6}/°$ C. at 25° C. in a direction parallel to the sheet, said composite solder substantially comprising continuous copper coated carbon fibers in a solder metal matrix, such that the copper coated carbon fibers occupy from 17 to 43 vol. % of the composite.

35. The solder joint of claim 29 wherein the sheet displays a thermal expansion coefficient of about $4 \times 10^{-6}/°$ C. at 25° C. in a direction parallel to the sheet, said composite solder substantially comprising continuous copper coated carbon fibers in a solder metal matrix, such that the copper coated carbon fibers occupy about 29 vol. % of the composite.

36. The solder joint as specified in claim 29, wherein at least a substantial portion of said carbon fibers extend in the same direction.

37. The solder joint as specified in claim 29, wherein said carbon fibers are conformed as a fabric.

38. The solder joint as specified in claim 29, wherein the precursor of said carbon fibers is pitch.

* * * * *